United States Patent
Frucht

(10) Patent No.: US 10,520,962 B2
(45) Date of Patent: Dec. 31, 2019

(54) SUPPLY VOLTAGE DETECTION DEVICE AND METHOD FOR DETECTING A SUPPLY VOLTAGE

(71) Applicant: Eaton Protection Systems IP GmbH & Co. KG, Schonefeld (DE)

(72) Inventor: Johannes Frucht, Soest-Ampen (DE)

(73) Assignee: EATON INTELLIGENT POWER LIMITED, Dublin (IE)

( * ) Notice: Subject to any disclaimer, the term of this patent is extended or adjusted under 35 U.S.C. 154(b) by 498 days.

(21) Appl. No.: 15/505,463

(22) PCT Filed: Aug. 21, 2015

(86) PCT No.: PCT/EP2015/001718
§ 371 (c)(1),
(2) Date: Feb. 21, 2017

(87) PCT Pub. No.: WO2016/026579
PCT Pub. Date: Feb. 25, 2016

(65) Prior Publication Data
US 2017/0269621 A1  Sep. 21, 2017

(30) Foreign Application Priority Data
Aug. 22, 2014 (DE) .......... 10 2014 012 664

(51) Int. Cl.
*G05F 1/575* (2006.01)
*G01R 15/22* (2006.01)
*G01R 19/165* (2006.01)

(52) U.S. Cl.
CPC ............. *G05F 1/575* (2013.01); *G01R 15/22* (2013.01); *G01R 19/16538* (2013.01)

(58) Field of Classification Search
CPC .... G05F 1/575; G01R 15/22; G01R 19/16538
See application file for complete search history.

(56) References Cited

U.S. PATENT DOCUMENTS

2018/0100881 A1\* 4/2018 Liu .................. G01R 15/22

FOREIGN PATENT DOCUMENTS

| DE | 10205313 | 8/2003 |
|---|---|---|
| DE | 102009022056 | 11/2010 |

(Continued)

OTHER PUBLICATIONS

Korean Office Action issued in Patent Application No. 2017-7007756, dated May 15, 2018, total 11 pages, office action 7 pages, translation of office action 4 pages, Korean Patent Office.

(Continued)

*Primary Examiner* — Daniel J Cavallari
(74) *Attorney, Agent, or Firm* — King & Spalding LLP

(57) ABSTRACT

The present invention relates to a supply voltage detection device (1), in particular for at least one load, for monitoring a rectified mains voltage of a mains voltage supply (2) and for comparing a detected mains voltage value with a predetermined reference value, wherein, if the detected mains voltage value is lower than the reference value, switching to e.g. an emergency voltage of an emergency voltage supply can be effected by means of an electronic control system (3). In addition, if a voltage limit value has been exceeded, the rectified mains voltage can be fed to an optocoupler (4) and a signal can be transmitted by said optocoupler for the duration of this excess, a duty factor that is dependent on the mains voltage value being determinable from the duration and the period of said signal.

16 Claims, 3 Drawing Sheets

(56) References Cited

FOREIGN PATENT DOCUMENTS

| JP | 2000-259263 | 9/2000 |
|----|-------------|--------|
| JP | 2004-013257 | 1/2014 |
| KR | 20-0114761  | 12/1997 |
| TW | M363021 U   | 8/2009 |

OTHER PUBLICATIONS

Machine Translation of JP2004-013257 via LexisNexis Total Patents, Aug. 15, 2018, 10 pages.
Machine Translation of JP2000-259263 via LexisNexis Total Patents, Aug. 15, 2018, 9 pages.
Machine Translation of KR20-0114761 via LexisNexis Total Patents, Aug. 15, 2018, 3 pages.
Chinese Office Action issued in Chinese Patent Application No. 201580044871.6, dated Dec. 5, 2018, 9 pages, with translation 2 pages.
Kleiber, Michael, International Search Report issued in application No. PCT/EP2015/001718, completion date Oct. 20, 2015, dated Oct. 28, 2015, 4 pages, European Patent Office, Netherlands.
Taiwan Intellectual Property Office (IPO), Office Action issued in Patent Application No. 104127386, dated Dec. 7, 2016, total 14 pages, office action 8 pages, translation of office action 6 pages, Taiwan.
Machine Translation of DE10205313 via LexisNexis Total Patents, Feb. 21, 2017, 5 pages.
Machine Translation of DE102009022056 via LexisNexis Total Patents, Feb. 21, 2017, 4 pages.
Machine Translation of TWM363021U via LexisNexis Total Patents, Feb. 21, 2017, 12 pages.

* cited by examiner

SUPPLY VOLTAGE DETECTION DEVICE AND METHOD FOR DETECTING A SUPPLY VOLTAGE

PRIORITY CLAIM

The present application is national phase application of and claims priority to International Application No. PCT/EP2015/001718 with an International filing date of Aug. 21, 2015, which claims priority to German Patent Application No. 10 2014 012 664.1, filed on Aug. 22, 2014. The foregoing applications are hereby incorporated herein by reference.

TECHNICAL FIELD

The present invention relates to a supply voltage detection device, in particular for at least one load, for monitoring a rectified mains voltage of a mains voltage supply.

BACKGROUND

Supply voltage detection devices are known in practice, cf. FIGS. 1 and 2. A supply voltage detection device of the type in question is used e.g. when, in a lighting system, the mains voltage fails and when switching to an emergency voltage is to be executed so as to further supply at least a few parts of the lighting system. To this end, the respective mains voltage value is detected and compared with the predetermined reference value. If the mains voltage value is below the reference value, switching to the emergency voltage supply will be effected. It is also possible to switch back from the emergency voltage supply to the mains voltage supply by means of the same electronic control system in response to a re-application of the mains voltage supply and a resultant mains voltage value higher than the predetermined reference value.

The respective predetermined reference value is predetermined e.g. through standards or the like.

FIG. 1 shows an example of a supply voltage detection device 1 known in practice. This supply voltage detection device comprises a rectifier 5 for rectifying the mains voltage supplied by a mains voltage supply 2. The rectified mains voltage is reduced via a voltage divider 13 with resistors 14 and 15, and capacitors 18 and 19 are provided so as to establish an adequately smoothed DC voltage. This voltage is supplied via an output 21 of an electronic control system 3. The applied voltage value is detected by means of this electronic control system and a comparison with the predetermined reference value is carried out accordingly. A load 17 is additionally shown in FIG. 1 in principle.

A disadvantage of the circuit shown according to FIG. 1 is that no galvanic separation exists between the mains voltage supply 2 and the electronic control system 3. Moreover, the load 17 may influence the voltage value detected at the output 21. The capacitors 18 and 19 are normally electrolytic capacitors for smoothing the voltage. These capacitors are additionally necessary, and for precise measurements of the mains voltage value a low-ripple voltage is required, so that the capacitors 18 and 19 have to satisfy the demands in question.

The circuit according to FIG. 2 shows a further example for a supply voltage detection device 1, which is known in practice. This supply voltage detection device is configured substantially analogously to the device according to FIG. 1, except that a transformer 20 is additionally connected between the mains voltage supply 2 and the rectifier 5. This transformer 20 constitutes a galvanic separation. Apart from that, the steps for detecting the mains voltage value and for comparing the latter with the reference value take place like in the case of FIG. 1.

With the exception of the galvanic separation, the disadvantages described in connection with FIG. 1 have to be taken into account also in FIG. 2. In addition, low-power transformers often have a characteristic in the case of which the mains voltage value applied to the output 21 may exhibit high fluctuations at low load variations.

In addition, a different mode of arrangement of the load 17 is shown in FIG. 2, cf. the arrangement between the mains voltage supply 2 and the transformer 20.

SUMMARY

It is the object of the present invention to improve a supply voltage detection device of the type referred to at the beginning in such a way that a respective mains voltage can be detected with higher accuracy and in a fast and reliable manner with less effort. A detected mains voltage value is compared with a predetermined reference value. If the detected mains voltage value is lower than the reference value, switching to e.g. an emergency voltage of an emergency voltage supply can be effected by means of an electronic control system.

According to the present invention, this object is achieved by the features according to claim 1. In particular, the supply voltage detection device according to the present invention is characterized in that, if a voltage limit value has been exceeded, the rectified mains voltage is fed to an optocoupler and a signal can be transmitted by said optocoupler for the duration of this excess, a duty factor that is dependent on the mains voltage value being determinable from the duration and the period of said signal.

BRIEF DESCRIPTION OF THE DRAWINGS

In the following, an advantageous embodiment of the present invention will be explained in more detail on the basis of the figures added in the drawing, in which.

DETAILED DESCRIPTION OF EXAMPLE EMBODIMENTS

Figure 1:
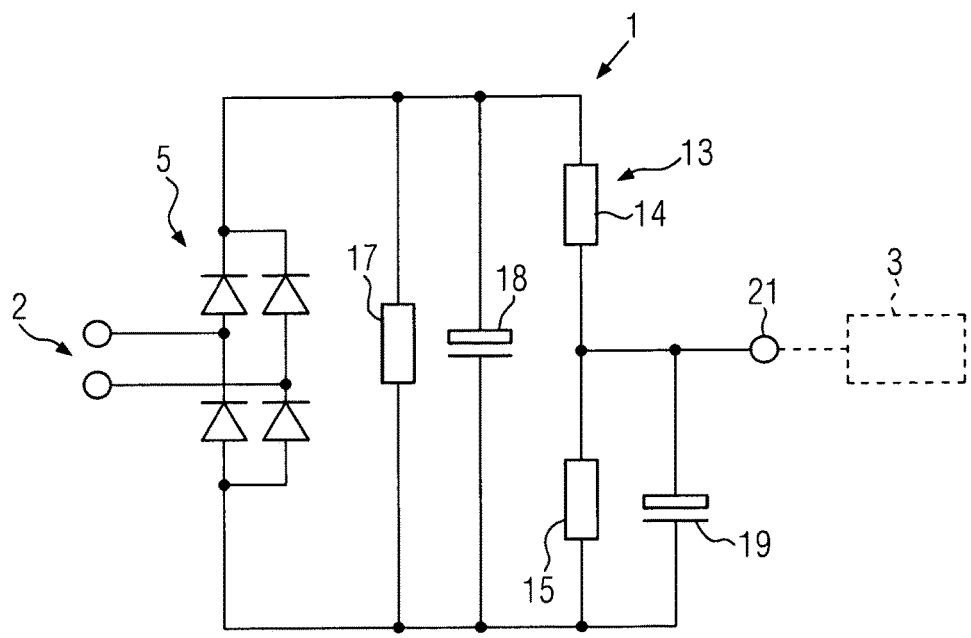
FIG. 1 shows a schematic representation of a supply voltage detection device known in practice.

According to the present invention, no capacitors are required for smoothing the voltage and the mains voltage value is detected digitally. Through the optocoupler, a galvanic separation is provided and, at the same time, the mains voltage value is digitally converted into a signal having a fixed value. As long as the mains voltage value exceeds a specific voltage limit value, the optocoupler will be active and the signal will be transmitted through the optocoupler for the duration of this excess. A duty factor that is dependent on the mains voltage value can then be determined from the duration and the period of said signal by means of the electronic control system.

This leads to an increase in accuracy and, at the same time, a galvanic separation is easily realized. It is true that the optocoupler is used as an additional component, but the use of respective capacitors can be dispensed with. When a suitable microcontroller is used as an electronic control system, the detection of the mains voltage value and the comparison with the respective reference value can be carried out with high accuracy and quickly. Hence, also a respective switching from e.g. mains voltage supply to emergency voltage supply can the carried out quickly and accurately. This can also be done the other way round, i.e. the emergency voltage supply can be switched back to mains voltage supply.

In the supply voltage detection device according to the present invention also a rectification of the mains voltage takes place, the circuit in question comprising a rectifier connected to the mains voltage supply.

In the circuit according to the present invention, a voltage limit value is additionally used, the optocoupler being active only if this voltage limit value is exceeded by the mains voltage value. This voltage limit value results from a Zener diode unit comprising at least one Zener diode that is connected between the rectifier and the optocoupler, i.e. the voltage limit value is determined by the respective Zener voltage.

At the same time, the Zener diode unit can easily be adapted to different operating conditions, e.g. by the use of some other Zener diode or by the use of a plurality of Zener diodes, so that, in this way, different Zener voltages and, consequently, voltage limit values for comparison with the mains voltage value can be realized.

In order to prevent a load caused by excessively high currents, a current limiting resistor may be connected in series with the Zener diode unit. Such a current limiting resistor may be defined by a plurality of resistors or by only one resistor.

In the case of a simple embodiment of an optocoupler, the latter comprises an LED (light emitting diode) as an optical transmitter and a phototransistor as an optical receiver.

The phototransistor receives light from the LED and is only conductive during such light reception, i.e. during the respective duration of the signal during which the mains voltage value exceeds the voltage limit value.

In order to allow an easily reproducible signal, whose level can easily be differentiated, to be fed to a respective keying output of the electronic control system, the phototransistor is able to control an electronic switching element, which is conductive substantially during the signal duration and which applies to the keying output an H-level during the signal duration and otherwise an L-level. The respective levels are detected by the electronic control system and used for determining the duty factor.

In particular, it should be pointed out once more that the L-level results, if the mains voltage value is smaller than the voltage limit value, and that, in this case, no signal will be transmitted by the optocoupler.

For reducing the respective voltage at the electronic switching component, the latter may have associated therewith a voltage divider.

It has already been pointed out that the electronic control system is connected to the keying output and determines thus the duty factor from the duration and the period of the signal. In order to allow a precise determination of the respective levels, the electronic control system may comprise a filtering unit.

It has been pointed out that the predetermined reference value serves the purpose of switching e.g. to the emergency voltage supply, if a mains voltage value smaller than this reference value should occur. The present invention allows not only such switching by means of the electronic control system, but also in the event that the mains voltage value should exceed the reference value, the respective mains voltage value can be determined via the duty factor. This is especially possible, if the voltage limit value is smaller than the reference value.

According to an advantageous embodiment, the Zener diode unit and the optical transmitter have arranged between them a series connection comprising a diode and a resistor. In particular, it will be of advantage in this context, when a capacitor can be charged via this series connection and with the respective resistor as part of a voltage divider. The latter is realized e.g. by a parallel connection of the respective capacitor and the diode.

This capacitor is charged via the series connection comprising the diode and the resistor, and the diode especially serves the purpose of preventing the capacitor from being discharged again, whenever a zero crossing of the supply voltage occurs. Through the diode, which is connected in parallel to the capacitor, it is guaranteed that the voltage across the capacitor will have a constant value. This has especially the effect that the optical receiver will always be operated with substantially the same power.

In the hitherto described embodiment of the present invention, the currents flowing through the Zener diode unit and the optocoupler were identically high. In the case of thermal changes, this may have the effect that the respective forward voltages of the optocoupler diode or the optical sensor and of the Zener diode unit lead to major changes of the pulse width repetition rate. In the case of the additional embodiment of the present invention, only a respective base current of the optical sensor flows across the Zener diode unit, and this will hardly result in any changes of the forward voltage. Hence, the optical receiver is operated with an almost constant current. This leads to a much more stable operation over a large temperature range in the case of the additional embodiment.

Figure 3:
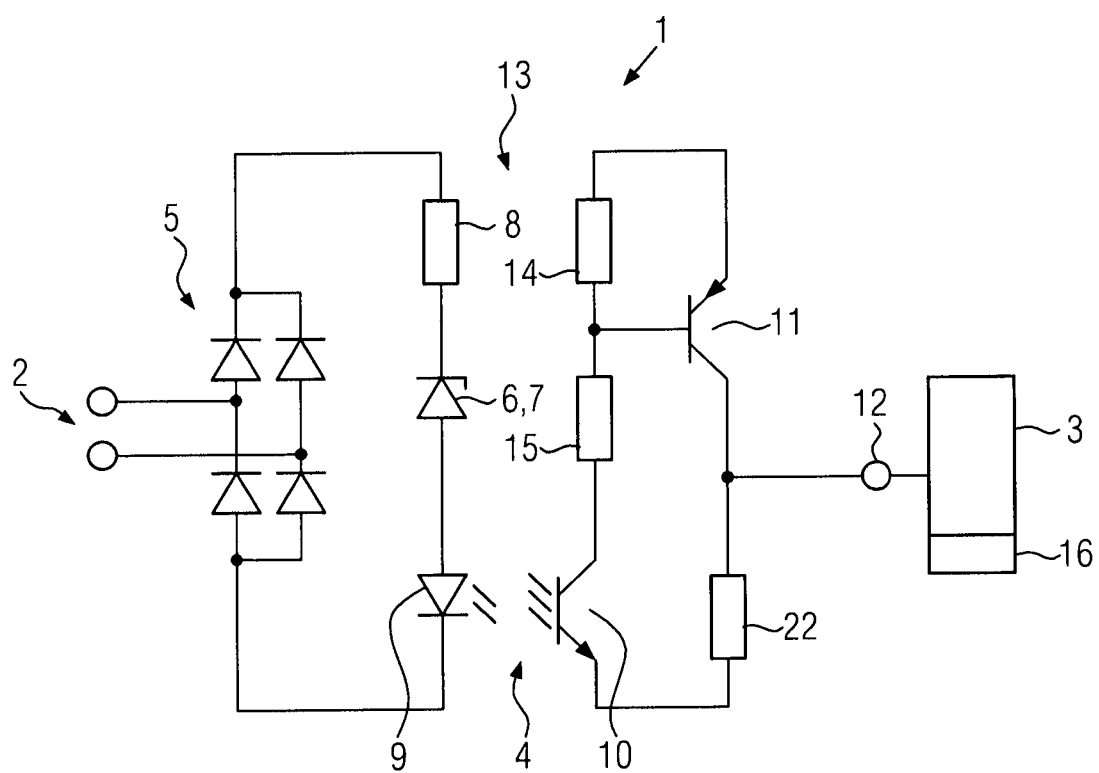
FIG. 3 shows a schematic representation of a supply voltage detection device according to the present invention with galvanic separation according to the first embodiment.

The supply voltage detection device 1 according to the present invention (FIG. 3) is connected to the mains voltage supply 2 via a rectifier 5. After the mains voltage has been rectified, it is supplied to an optocoupler 4 via a current limiting resistor 8 and a Zener diode unit 6, 7. Smoothing of the voltage by means of capacitors, such as electrolytic capacitors or the like, does not take place.

The rectified mains voltage serves to actuate the optocoupler. A Zener diode unit 6 is connected between the rectifier 5 and the optocoupler 4. This Zener diode unit 6 comprises at least one Zener diode 7. Only if a mains voltage value exceeds a respective Zener voltage as a limiting voltage, the optocoupler will be activated, with an LED 9 acting as an optical transmitter and a phototransistor 10 as an optical receiver. At the same time, current limitation is allowed through the current limiting resistor 8 comprising one or a plurality of resistors, said current limiting resistor 8 being connected in series between the Zener diode 7 and the rectifier 5.

The phototransistor 10 of the optocoupler is conductive, if the mains voltage value is higher than the voltage limit value determined by the Zener voltage. When the phototransistor 10 is conductive, it controls an electronic switching element 11, so that the latter will be conductive as well. Hence, an H-level signal is applied to the keying output 12. If the mains voltage value is lower than the voltage limit value, the optocoupler will be inactive and the phototransistor 10 nonconductive. Hence, an L-level signal is applied to the keying output 12.

It should additionally be pointed out that the mains voltage normally has a frequency of 50 Hz, so that a corresponding signal of 100 Hz will be applied to the keying output 12 due to the respective rectification of the mains voltage. The respective duty factor or pulse width repetition rate results as an on-off ratio or in particular as a ratio of signal duration to signal period. In this respect, it should additionally be taken into account that the duty factor or pulse width repetition rate depends on the magnitude of the mains voltage value. If the mains voltage is low, the duration of the H-level signal will be short and if the mains voltage is high, the duration of the H-level signal will be long. This means that the duty factor or the pulse width repetition rate provides the possibility of saying something definite about the mains voltage value, since it indicates the respective dependence of the duty factor on the mains voltage value.

The duration of the H-level signal, the L-level signal, the duty factor and the like are determined by the electronic control system 3, which may be configured e.g. as a microcontroller. The latter may comprise a filtering unit, which allows a precise determination of the respective levels. Such a filtering unit 16 may also be realized in the form of software within the microcontroller.

Figure 4:
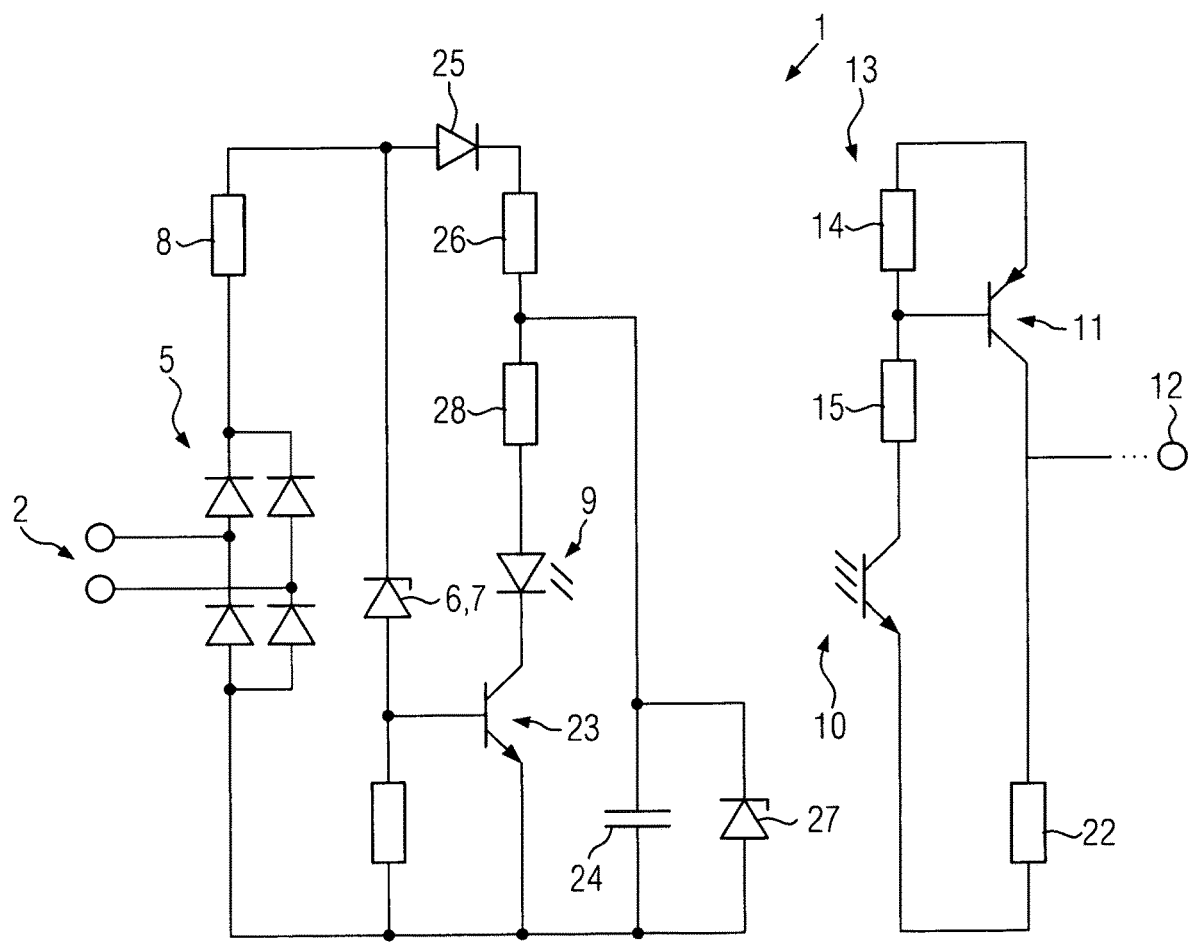
FIG. 4 shows a second embodiment of the supply voltage detection device according to the present invention.

FIG. 4 shows a further embodiment of a supply voltage detection device 1 according to the present invention. Like parts are identified by like reference numerals in comparison with the first embodiment according to FIG. 3.

In the embodiment according to FIG. 4, a series connection comprising the diode 25 and the resistor 26 is arranged in particular between the Zener diode unit 6 and the optocoupler or the optical transmitter 9. Via this series connection, the current flows not only in the direction of the optical transmitter 9 but also in the direction of a parallel arrangement comprising the capacitor 24 and the Zener diode 27. The resistor 26 is part of a voltage divider, which comprises the additional resistor 28 between the resistor 26 and the optical transmitter 9. The parallel arrangement comprising the capacitor 24 and the Zener diode 27 is supplied from this voltage divider. On the side of the optical receiver, the setup corresponds to that of the embodiment according to FIG. 3.

In the embodiment according to FIG. 4, it should especially be taken into account that, at a specific voltage, the optical transmitter 9 will always be conductive. This specific voltage is determined by a Zener diode unit 6 comprising a suitable Zener diode 7. As long as the voltage after the rectifier 5 is higher than the respective value of this Zener diode unit 6, the optical transmitter 9 will be conductive. After the rectifier 5, a non-filtered rectified voltage occurs, i.e., at 50 Hz mains voltage supply, a 100 Hz signal will occur.

However, the mains voltage supply exhibits zero crossings in the case of which pauses in the supply of the optical transmitter 9 occur, i.e. the optocoupler is not controlled in these pauses. At a high input voltage, such a pause will be comparatively short, and the lower the input voltage or mains voltage supply is, the longer the pause will be.

The optical transmitter 9 determines the pulse width repetition rate depending on the mains voltage supply. The capacitor 24 is charged via the diode 25 and the resistor 26. The diode 25 prevents the capacitor 24 here from being discharged again, whenever the above mentioned zero crossings occur. Due to the fact that the Zener diode 27 is connected in parallel to the capacitor 24, the voltage across the capacitor 24 is fixed at a constant value, so that the optocoupler will always be operated with the same power.

Another advantage obtained in this context according to the second embodiment is that according to the first embodiment the current flowing across the Zener diode unit corresponds to the current flowing through the optocoupler. If thermal changes occur, this may have the effect that the forward voltage of the optical transmitter and of the Zener diode unit may lead to changes of the pulse width repetition rate. In the case of the second embodiment, only the respective base current of the optical transmitter flows across the Zener diode unit 6, and this will hardly result in any changes of the forward voltage, i.e. the optical receiver 10 is now continuously operated with an almost constant current. This leads to a more stable operation of the supply voltage detection device over a large temperature range.

Figure 2:
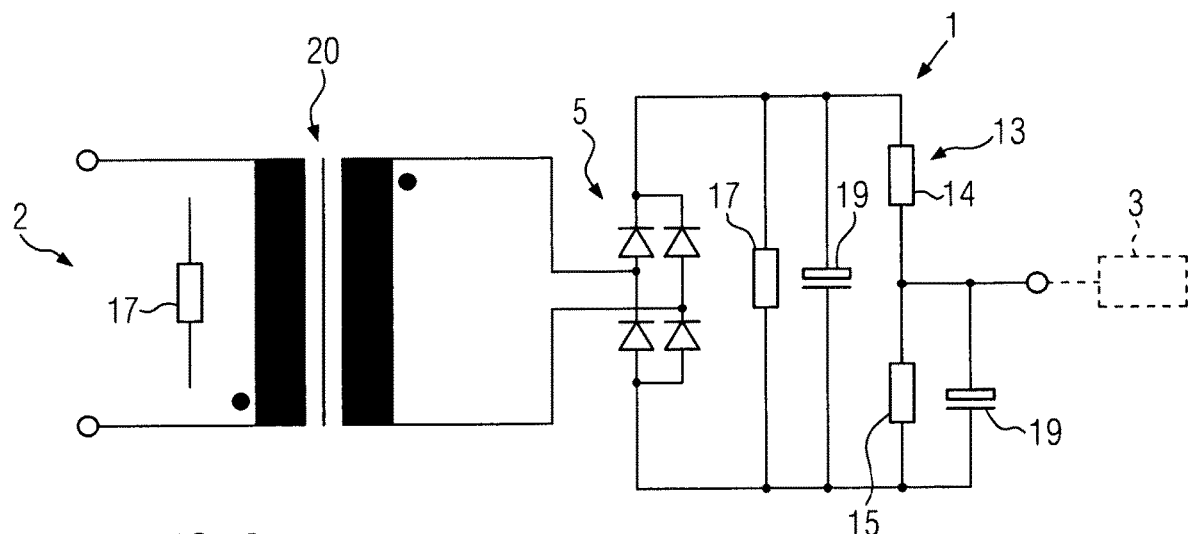
FIG. 2 shows a further example of a supply voltage detection device known in practice.

According to the present invention, a circuit with galvanic separation is thus obtained, which e.g. allows, in a simple and accurate manner, a determination of a mains voltage value and a decision concerning switching between the mains voltage supply and the emergency voltage supply. The respective waveforms of the signal are not influenced by different load situations, cf. the statements made in connection with FIGS. 1 and 2, and in particular the use of electrolytic capacitors can be dispensed with.

Since the mains voltage value is determined very precisely, it is, of course, also possible to carry out a correspondingly precise comparison with the predetermined reference value, so as to take, if necessary, a decision concerning switching between the mains voltage supply and the emergency voltage supply. Respective demands specified by standards or the like are thus reliably complied with.

In addition, attention should be paid to the fact that the Zener diode unit for predetermining a respective voltage limit value is selectable. It has already been pointed out that the voltage limit value results from the Zener voltage and that it determines the power-on and power-off times of the optocoupler through a comparison with the mains voltage value.

The supply voltage detection device according to the present invention can be used in an emergency lighting system or the like, i.e. in all units whose operation has to be continued by means of an emergency voltage supply, if e.g. the mains voltage should fail. The present invention allows not only a detection of the respective mains voltage value but also a reliable and precise determination of a suitable moment in time for switching to emergency voltage supply or back to mains voltage supply. Depending on the respective field of use, the supply voltage detection device can be arranged at different locations. It is imaginable to associate the device with the mains voltage supply or with a central battery or the like, which provides the respective emergency voltage. In addition, the supply voltage detection device may also be used more than once, e.g. in connection with especially explosion-proof lights in the lighting system of a building. This applies quite generally also to an explosion-proof electrical installation technology used for lighting and also for monitoring, controlling, signaling, measurement and control technology as well as for the distribution of electric power in explosion-prone areas. It goes without saying that, instead of switching over to emergency voltage supply, it will also be possible to take, in response to specific mains voltage values, other measures concerning e.g. explosion protection or the like. In addition it would be possible to cause, at least above the voltage limit value, different reactions in the case of different mains supply voltage values, since the present invention allows the mains voltage value to be detected quickly and precisely. This means that the mains voltage value may also be compared with a plurality of predetermined reference values, so as to trigger, depending on the magnitude of the mains voltage value in question, different reactions in the case of the respective reference value.

The invention claimed is:

1. A supply voltage detection device, for at least one load, for monitoring a rectified mains voltage of a mains voltage supply and for comparing a detected mains voltage value with a predetermined reference value, wherein, if the detected mains voltage value is lower than the predetermined reference value, switching to e.g. an emergency voltage of an emergency voltage supply can be effected by means of an electronic control system, characterized in that, if a voltage limit value has been exceeded, the rectified mains voltage is fed to an optocoupler and a signal can be transmitted by said optocoupler for a duration of this excess, a duty factor that is dependent on the mains voltage value being determinable from the duration and a period of said signal.

2. The supply voltage detection device according to claim 1, further comprising a rectifier connected to the mains voltage supply.

3. The supply voltage detection device according to claim 1, characterized in that a Zener diode unit comprising at least one Zener diode is connected between the rectifier and the optocoupler, the voltage limit value being determined by the Zener voltage.

4. The supply voltage detection device according to claim 3, characterized in that a current limiting resistor is connected in series with the Zener diode unit.

5. The supply voltage detection device according to claim 1, characterized in that the optocoupler consists of at least one LED as an optical transmitter and a phototransistor as an optical receiver.

6. The supply voltage detection device according to claim 5, characterized in that the phototransistor is conductive substantially during the signal duration.

7. The supply voltage detection device according to claim 5, characterized in that the phototransistor controls an electronic switching element, which is conductive substantially during the signal duration and which applies to a keying output an H-level and otherwise an L-level.

8. The supply voltage detection device according to claim 7, characterized in that the L-level results, if the mains voltage value is smaller than the voltage limit value and that in this case no signal can be transmitted by the optocoupler.

9. The supply voltage detection device according to claim 7, characterized in that the electronic switching element has associated therewith a voltage divider.

10. The supply voltage detection device according to claim 7, characterized in that the electronic control system is connected to the keying output.

11. The supply voltage detection device according to claim 1, characterized in that the electronic control system comprises a filtering unit.

12. The supply voltage detection device according to claim 1, characterized in that the voltage limit value is smaller than or equal to the predetermined reference value.

13. The supply voltage detection device according to claim 5, characterized in that the Zener diode unit and the optical transmitter have arranged between them a series connection comprising at least one diode and a resistor.

14. The supply voltage detection device according to claim 5, characterized in that the optical receiver sensor has associated therewith a voltage divider, which is connected to a parallel connection comprising a capacitor and a Zener diode.

15. The supply voltage detection device according to claim 13, characterized in that the resistor of the series connection comprising the diode and the resistor is part of the voltage divider.

16. A method for detecting a mains voltage of a mains voltage supply, for at least one light, comprising the steps of detecting a mains voltage value of a rectified mains voltage of the mains voltage supply and comparing it with a predetermined reference value and, if the detected mains voltage value is lower than a reference value, switching to an emergency voltage of an emergency voltage supply by means of an electronic control system, and, in addition, feeding the rectified mains voltage to an optocoupler, if a voltage limit value has been exceeded, and transmitting a signal by said optocoupler for a duration of this excess as well as determining a duty factor that is dependent on the mains voltage value from the duration and a period of said signal.

* * * * *